United States Patent [19]

Richards

[11] 4,409,541

[45] Oct. 11, 1983

[54] METHOD OF AND APPARATUS FOR DETERMINING CONTINUITY OF AN ELECTRICAL CONDUCTOR

[75] Inventor: Raymond G. Richards, Summerside, Canada

[73] Assignee: PPG Industries, Inc., Pittsburgh, Pa.

[21] Appl. No.: 245,473

[22] Filed: Mar. 19, 1981

[51] Int. Cl.³ .................... G01R 31/02; G01R 27/26
[52] U.S. Cl. .................................. 324/51; 324/61 R
[58] Field of Search ............ 324/51, 52, 60 C, 61 R, 324/60 R

[56] References Cited

U.S. PATENT DOCUMENTS

| | | | |
|---|---|---|---|
| 2,490,377 | 12/1949 | MacLean | 324/60 C |
| 2,746,295 | 5/1956 | Lubkin | 324/60 R X |
| 3,068,409 | 12/1962 | Bigliano | 324/51 X |
| 3,646,433 | 2/1972 | Eilersen | 324/60 R |
| 3,688,206 | 8/1972 | Eide | 324/60 R X |

FOREIGN PATENT DOCUMENTS 139307  12/1979  Fed. Rep. of Germany ........ 324/51

OTHER PUBLICATIONS

Oliver et al., "Electronic Measurements and Instrumentation"-McGraw Hill-1972-p. 708.

Primary Examiner—Stanley T. Krawczewicz
Assistant Examiner—Jose M. Solis
Attorney, Agent, or Firm—William D. West; Donald Carl Lepiane

[57] ABSTRACT

Continuity of antenna wire of an antenna windshield is determined by mounting two electroconductive receiving plates in space relationship to one another and to an electroconductive transmitting plate. The receiving plate and transmitting plate are positioned over and spaced from segments of the antenna wire. The transmitting plate is energized to form capacitors or capacitance couplings (1) between segments of the antenna wire and the plate and (2) between the receiving plates and transmitting plates. The potential difference between the receiving plates is measured to determine wire continuity.

17 Claims, 8 Drawing Figures

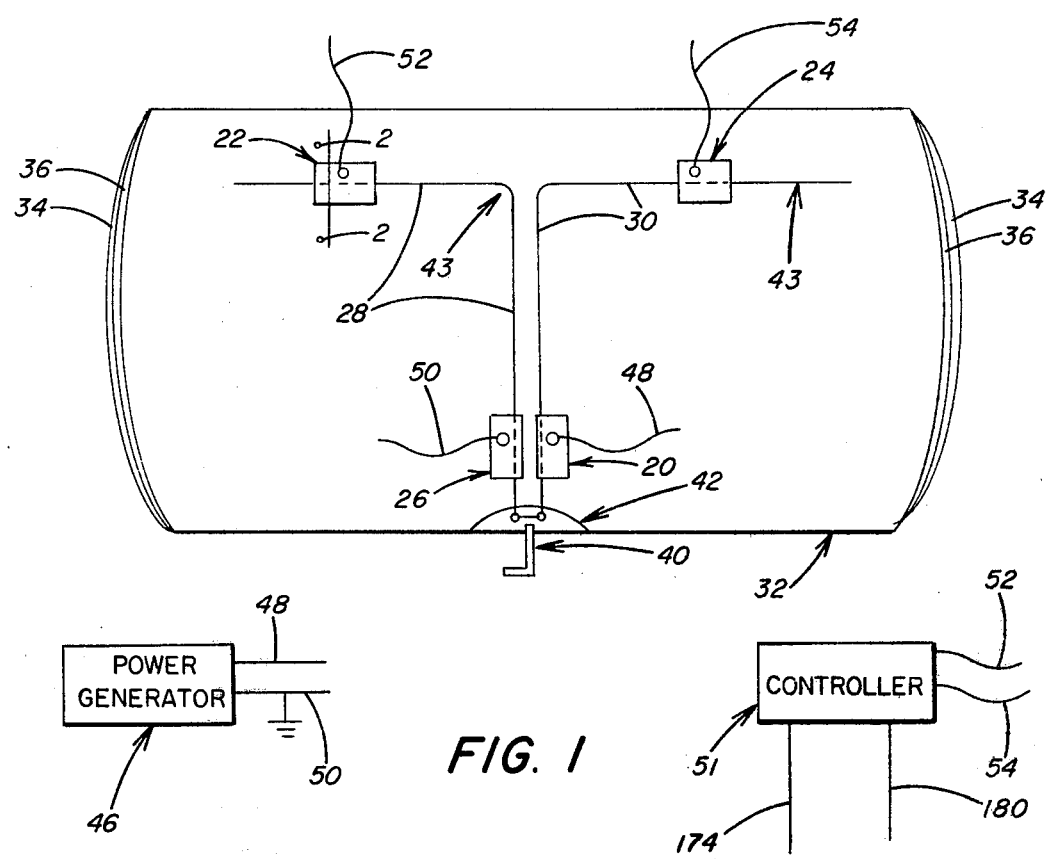
FIG. 1
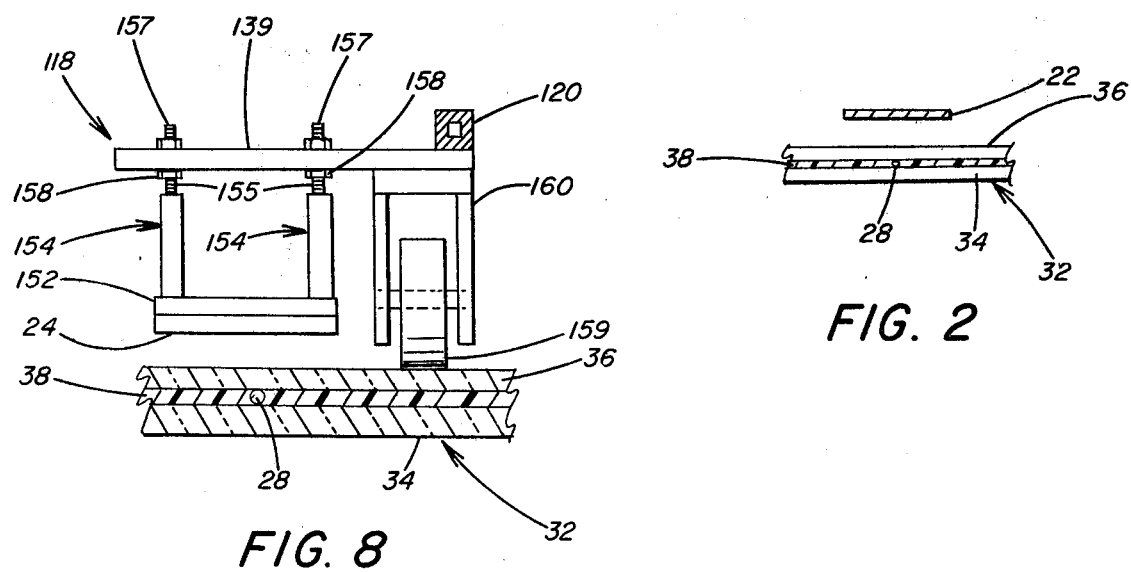
FIG. 8
FIG. 2

METHOD OF AND APPARATUS FOR DETERMINING CONTINUITY OF AN ELECTRICAL CONDUCTOR

BACKGROUND OF THE INVENTION

1. Field of the Invention

This invention relates to a method of and apparatus for testing continuity of an electrical conductor and, more particularly, for testing continuity of antenna wire of an antenna windshield.

2. Discussion of the Available Techniques

U.S. Pat. No. 3,543,272 teaches a windshield having an antenna system i.e. an antenna windshield. In general, the antenna system includes one or more wires i.e. antenna wires between a pair of laminated glass sheets and a connector for providing external electrical access to the wires. Antenna systems may be tested by listening to a radio connected to the connector of the antenna system or by connecting a transmitter to the connector and measuring the transmitted signal e.g. as taught in U.S. Patent application Ser. No. 18,685 filed on Mar. 8, 1979, in the names of L. D. Bryant and H. S. Koontz for Probe for testing conductor of an antenna windshield.

Although both of the above techniques are acceptable, it can be appreciated that test time and labor can be reduced if the time and labor required for connecting the transmitter or radio circuit are eliminated.

SUMMARY OF THE INVENTION

This invention relates to a method of determining continuity of a conductor e.g. antenna wires or wire of a windshield antenna system. A transmitting capacitance coupling e.g. an electrically conductive plate overlaying and spaced from a section of the antenna wire and connected to a power source is provided intermediate the wire ends. A pair of spaced receiving capacitance couplings e.g. a pair of electrically conductive plates each over a section of the antenna wire are provided one on each side of the transmitting capacitance coupling. The potential difference between the receiving couplings is measured to determine wire continuity. For example, if the potential difference is zero, the portion of the antenna wire between the receiving couplings is continuous, and if the potential difference is other than zero, the wire portion is noncontinuous i.e. there is a break in the antenna wire.

The invention also relates to an apparatus that may be used for carrying out the above described method.

The present invention reduces test time and labor for determining continuity of antenna wire or wires of an antenna windshield system by eliminating the time and labor required for connecting the antenna system to a transmitter or a radio.

BRIEF DESCRIPTION OF THE DRAWING

FIG. 1 is a front, elevated view illustrating the position of electrically conductive plates relative to the antenna wire of an antenna windshield to establish a transmitting capacitance coupling and receiving capacitance couplings in accordance with the teachings of the invention;

FIG. 2 is a view taken along lines 2—2 of FIG. 1;

FIG. 8 is a view taken along lines 8—8 of FIG. 6.

DESCRIPTION OF THE INVENTION

Figure 3:
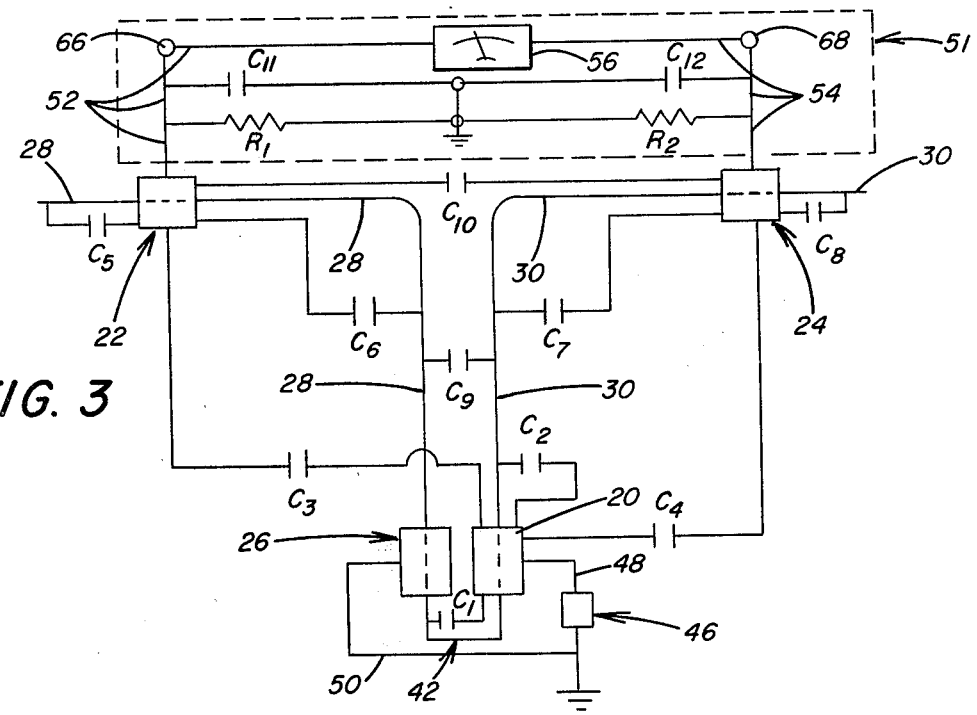
FIG. 3 is an electric schematic formed between the transmitting and receiving capacitance couplings and the antenna wire of the antenna windshield in accordance with the teachings of the invention.

In FIG. 1 there is shown electrical conductive plates 20, 22, 24 and 26 selectively mounted over and spaced from segments of antenna wire sections 28 and 30 of antenna automotive windshield 32 in accordance with the teachings of the invention to establish capacitors between the plates and wire segments in a manner to be discussed below. Referring also to FIG. 2, the windshield 32 includes a pair of glass sheets 34 and 36 conveniently laminated together about an interlayer 38. The antenna wire portions 28 and 30 are between the glass sheets 34 and 36 and are electrically interconnected to one another and to a connector of plug assembly 40 at 42 to provide electrical external access to antenna wire 43. As will be appreciated, the invention is not limited to the construction of the antenna windshield to be tested, and any configuration of antenna wire 43 of antenna windshields including those taught in U.S. Pat. No. 3,543,272 and U.S. Pat. No. 3,484,584 which teachings are hereby incorporated by reference may be tested in accordance with the teachings of the invention. Further, as will be appreciated, the invention can be practiced on current carrying conductors for heating such as the type used in aircraft industry e.g. taught in U.S. Pat. Nos. 3,974,359 and 3,789,192 and/or in the automotive industry e.g. taught in U.S. Pat. No. 3,484,584 which teachings are hereby incorporated by reference.

In the practice of the invention, the plate 20 is a transmitting plate 20 and the plates 22 and 24 are receiving plates 22 and 24 respectively. The plates 20, 22 and 24 are positioned relative to one another so that the transmitting plate 20 is over a wire portion between and spaced from the wire portion below the receiving plates 22 and 24 for reasons discussed below. In the instance where the transmitting plate 20 is adjacent two spaced wire segments as illustrated in FIG. 1, a plate 26 referred to as a guard plate 26 to be discussed in more detail below is mounted adjacent to and electrically isolated e.g. spaced from the transmitting plate 20 and over the adjacent wire segment.

With continued reference to FIG. 1, a power source or generator 46 e.g. an AC power source having 200 volts peak to peak at one kilohertz has one output conveniently connected to the transmitting plate 20 by cable 48 and the other output conveniently connected to the guard plate 26 and ground by way of cable 50 to selectively establish a plurality of capacitance couplings between the antenna wire portions 28 and 30 and the plates 20, 22 and 24. The receiving plates 22 and 24 are conveniently connected to a controller 51 by cable 52 and 54 respectively. The controller 51, among other things to be discussed below, measures the potential difference between the receiving plates 22 and 24 to determine antenna wire continuity and energizes marking equipment to indicate acceptable antenna windshields in a manner discussed below.

When the power source 46 is energized, a series of capacitors, as shown in FIG. 3, are formed between the transmitting plate 20, receiving plates 22 and 24, and antenna wire portions 28 and 30. For example, but not limiting to the invention, a capacitor designated as $C_1$ is established between a segment of the antenna wire 43 at 42, i.e. the interconnection of the wire portions 28 and 30 and the transmitting plate 20; a capacitor designated as $C_2$ is established between a segment of the wire portion 30 and the transmitting plate 20; a capacitor designated as $C_3$ is established between the transmitting plate 20 and the receiver plate 22; a capacitor designated as $C_4$ is established between the transmitting plate 20 and receiver plate 24; capacitors designated as $C_5$ and $C_6$ are established between receiving plate 22 and adjacent segments of the wire portions 28; capacitors designated as $C_7$ and $C_8$ are established between the receiving plate 24 and adjacent segments of the wire portion 30; a capacitor $C_9$ is established between adjacent wire portions 28 and 30 and a capacitor designated as $C_{10}$ is established between the receiving plates 22 and 24. There is no capacitance coupling between the guard plate 26, the underlying wire portion and the transmitting plate 20 because the guard plate 26 is grounded. The controller 51 includes a meter 56 having it output electrically connected to the receiving plates 22 and 24 by the cables 52 and 54 respectively. As shown in FIG. 3, the potential difference measuring circuit in addition to the meter includes the cable 52 electrically connected to one end of capacitor $C_{11}$ and one end of resistor $R_1$ with the other end of the capacitor $C_{11}$ and of the resistor $R_1$ connected to ground, to one end of a capacitor $C_{12}$ and one end of a resistor $R_2$. The other end of the capacitor $C_{12}$ and of the resistor $R_2$ is electrically connected to the cable 54.

For the purposes of maintaining adquate output and sensitivity, resistors $R_1$ and $R_2$ are of the order of 10 megohms and capacitors $C_{11}$ and $C_{12}$ are of the order of 1.0 picofarad. This can be achieved automatically by using a differential controller 51 having an input resistance of 1 megohm shunted by a 10 picofarad capacitor on each input and by inserting a 10 megohm resistor in series with the receiver plates 22 and 24 before connection to the differential inputs of the controller 51. In effect, the input resistance is multiplied by 10 and the input capacitance reduced by 1/10.

Figure 4:
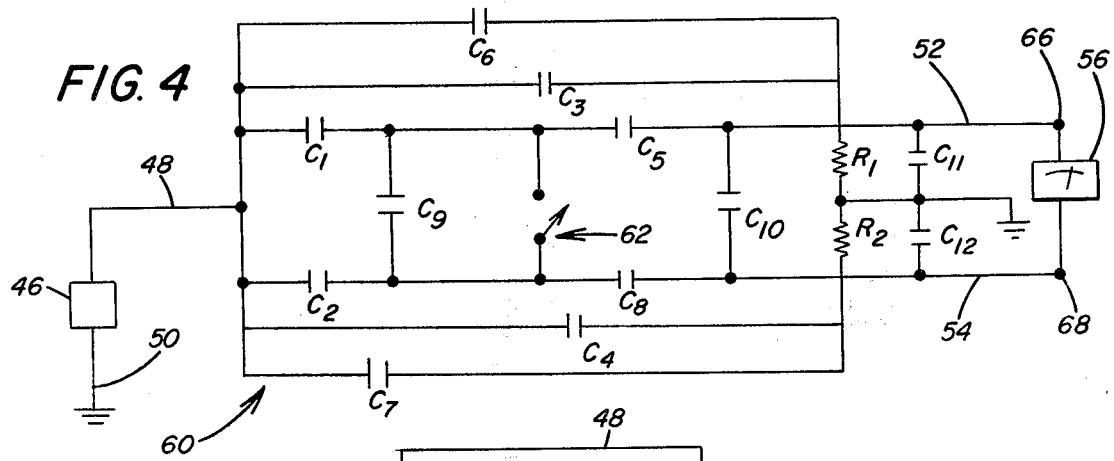
FIG. 4 is the circuit of the electrical components shown in FIG. 3.

Referring now to FIG. 4 and for ease of appreciating and discussing the invention, there is shown a circuit 60 which is the circuit of the electrical components illustrated in FIG. 3. The condition of the wire segments 28 and 30 i.e. antenna wire 43 are shown in the circuit 60 of FIG. 4 by a switch 62 connected at one end to one end of the capacitors $C_2$, $C_8$, and $C_9$ and connected at the other end to one end of the capacitors $C_1$, $C_5$, and the other end $C_9$. The condition of the wire portions 28 and 30 is illustrated by the position of the switch 62. For example, when the switch 62 is in the closed position, the circuit 60 illustrates an antenna wire that is continuous i.e. no break in the wire portions 28 and 30. When the switch 62 is in the open position as shown in FIG. 4, the circuit 60 illustrates an antenna wire 43 that is noncontinuous i.e. there is a break or separation in the wire portions 28 and 30.

Figure 5:
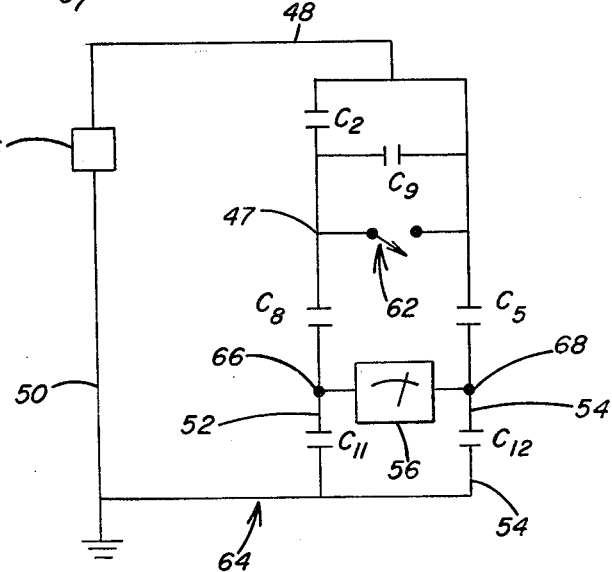
FIG. 5 is a simplified circuit of the circuit shown in FIG. 4 having electrical components removed under expected conditions discussed below.

Because of symmetry, the capacitance value of the capacitors $C_3$, $C_4$, $C_6$, and $C_7$ are equal. $R_1$ and $R_2$ are selected to be equal. Capacitor $C_{10}$ has a very small capacitance because of the distance between the receiving plates 22 and 24 and their orientation relative to one another. Referring now to FIGS. 3 and 5, the guard plate 26 greatly reduces the value of $C_1$ relative to $C_2$ and therefore $C_1$ can be removed from the circuit. Further simplifying the discussion of the invention, the capacitors $C_1$, $C_3$, $C_4$, $C_6$, $C_7$ and $C_{10}$, and resistors $R_1$ and $R_2$ are removed from the circuit 60 shown in FIG. 4 to provide circuit 64 shown in FIG. 5. With the switch 62 closed (simulating a continuous antenna wire), the signal delivered by the source 46 to the capacitors $C_5$ and $C_8$ with respect to the ground 50 are identical and therefore the meter 56 reads zero. However, with the switch 62 open (simulating a discontinuous antenna wire), the signal delivered to $C_5$ with respect to the ground 50 is greatly reduced since $C_9$ is much smaller than $C_2$. This means that the voltage delivered to $C_8$ with respect to the ground 50 is much greater than that delivered to $C_5$ hence the meter 56 shows a value other than zero. With the above discussion in mind, the electrical components of the circuit 64 of FIG. 5 provide the relationship at terminal 66 and terminal 68 shown in Equation 1 and 2.

$$\frac{V_{66}}{V_{47}} = \frac{\frac{1}{2\pi f C_{11}}}{\frac{1}{2\pi f C_8} + \frac{1}{2\pi f C_{11}}} \quad \text{Equation 1}$$

$$\frac{V_{68}}{V_{47}} = \frac{\frac{1}{2\pi f C_{12}}}{\frac{1}{2\pi f C_5} + \frac{1}{2\pi f C_9} + \frac{1}{2\pi f C_{12}}} \quad \text{Equation 2}$$

where
$V_{47}$ is the voltage at the terminal 47 shown in FIG. 5 with respect to the ground 50 of the power source is 46;
$V_{66}$ is the voltage at the terminal 66 interconnecting the meter 56 to one end of the capacitors $C_8$ and $C_{11}$ as shown in FIG. 5;
$V_{68}$ is the voltage at the terminal 68 interconnecting the other end 68 of the meter 56 to one end of the capacitors $C_5$ and $C_{12}$ as shown in FIG. 5;
f is the frequency of the source 46; and
$C_5$, $C_8$, $C_9$, $C_{11}$, and $C_{12}$ are as previously discussed.

Equation 2 is substrated from Equation 1 after which $1/2\pi f$ is cancelled to give following Equation 3.

$$V_{66} - V_{68} = V_{47} \left[ \frac{1}{\frac{C_{11}}{C_8} + 1} - \frac{1}{\frac{C_{12}}{C_5} + \frac{C_{12}}{C_9} + 1} \right] \quad \text{Equation 3}$$

where
$V_{47}$, $V_{66}$, $V_{68}$, $C_5$, $C_8$, $C_9$, $C_{11}$ and $C_{12}$ are as previously defined;
The voltage at terminal 47 is determined from following Equation 4.

$$V_{47} = V_{46} \left[ \frac{\frac{1}{2\pi f C_E}}{\frac{1}{2\pi f C_E} + \frac{1}{2\pi f C_2}} \right] \quad \text{Equation 4}$$

where
$C_E$ is equal to $$\left(\frac{1}{C_8} + \frac{1}{C_{11}}\right)^{-1} + \left(\frac{1}{C_9} \quad \frac{1}{C_5} \quad \frac{1}{C_{12}}\right)^{-1}$$

and $C_5$, $C_8$, $C_9$, $C_{11}$ and $C_{12}$ are as previously defined;
$V_{46}$ is the voltage of the source 46; and
$V_{47}$ is as previously defined.

By selection $C_{11}$ is equal to $C_{12}$ and by orientation $C_8$ is equal to $C_5$. Therefore, equation 3 can be rewritten into following Equation 5.

Equation 5
$$V_{66} - V_{68} = V_{47}\left[\frac{1}{\frac{C_{11}}{C_8} + 1} - \frac{1}{\frac{C_{11}}{C_8} + \frac{C_{11}}{C_9} + 1}\right]$$

where $V_{47}$, $V_{66}$, $V_{68}$, $C_8$, $C_9$ and $C_{11}$ are as previously defined.

Equation 5 is non-zero when there is a break in the antenna wire (the switch 62 is open) because the term $C_{11}/C_9$ is a value other than zero. If the antenna wire is continuous (the switch 62 is closed) $C_9$ becomes infinite (zero capacitive reactance) and the terms $C_{11}/C_9$ goes to zero as does Equation 5.

From the circuits shown in FIGS. 4 and 5 it can be seen that the voltage difference between the terminals 66 and 68 can be amplified by increasing the output of the power source 46; and increasing the value of capacitors $C_2$. The capacitance value of the capacitors $C_1$, $C_2$, $C_5$, $C_8$ and $C_9$ can be controlled by physical restraints; such as, the spacing between the conductive plates and their respective underlying portion of the wires 28 and 30 and the area of the conductive plates. The invention may be practiced using a copper sheet, about 0.005 inches (0.13 millimeters) thick conveniently secured to an epoxy board. The copper sheet has a length of 6 inches (15 centimeters) and a width of 3 inches (7.5 centimeters) and is spaced about 1/32 inch (7 millimeters) from the adjacent glass sheet surface.

As can now be appreciated, the invention may be used for checking the continuity of a wire other than antenna wire; for example, the invention may be used to determine electrical continuity of the pattern of automotive heated backlights, aircraft windshields or may be adapted for testing continuity of electrical conductors of appliances.

The invention is practiced for determining continuity of antenna wire of antenna windshields moving along a conveyor into a testing station. As can now be appreciated, the invention is not limited to the construction of the conveyor for conveying the windshields or of the structure for mounting the plates 20, 22, 24 and 26 relative to the moving windshields.

Figure 6:
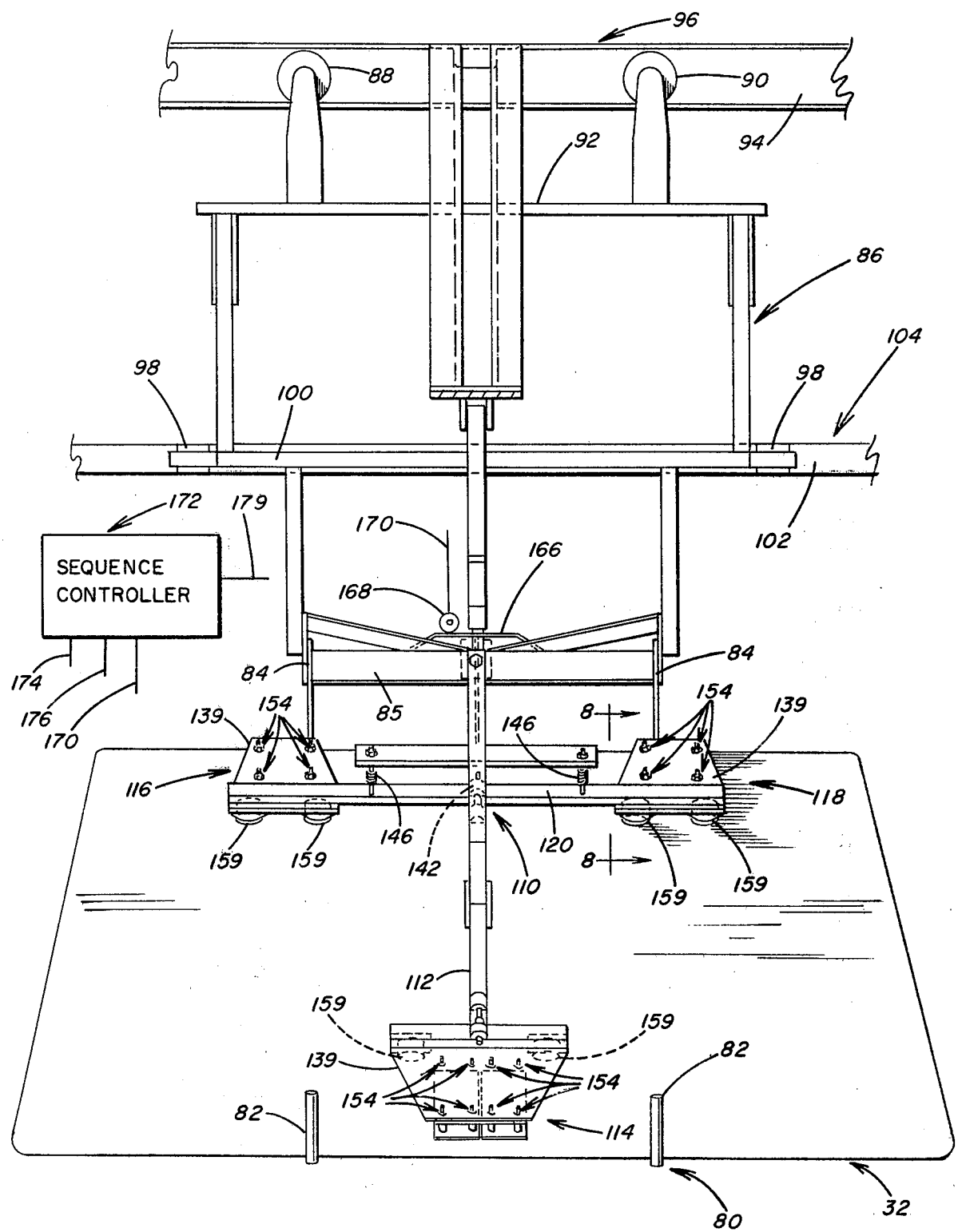
FIG. 6 is a front elevated view of an antenna windshield moved into a test position for testing of the antenna wire in accordance with the teachings of the invention.
Figure 7:
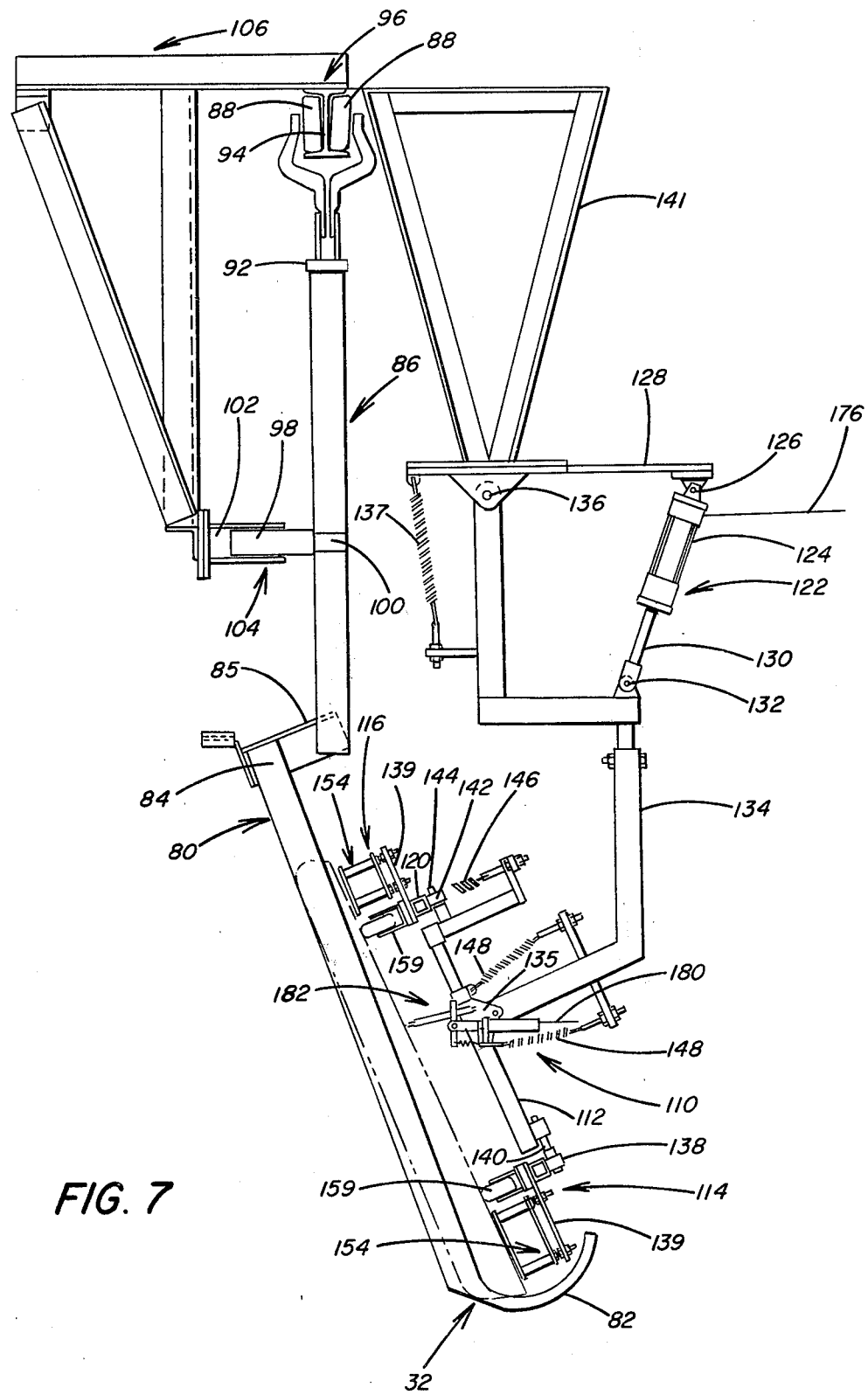
FIG. 7 is a side view of the test position shown in FIG. 6 having structure added or deleted when compared to FIG. 6 for purposes of clarity.

If the following discussion, like numbers refer to like elements. With reference to FIGS. 6 and 7, the windshield 32 is mounted on windshield carriage 80 which is tilted for conveying stability of the windshield 32. The carriage 80 has a pair of spaced L-shaped arms 82 secured at 84 on lower horizontal strut 85 of rigid carrier 86. The carrier 86 has a first pair of wheels 88 spaced from a second pair of wheels 90 rotably mounted on upper horizontal strut 92 of the carriage 86. The wheels 88 and 90 ride in tracks 94 of I-beam 96. A guide wheel 98 is rotably mounted on each end of intermediate horizontal strut 100 of the carrier 86 and rides in groove 102 of track 104. The I-beam 96 and track 104 are supported above the floor by overhead super structure 106 shown only on FIG. 7. The carrier wheels 88 and 90 of the carriage 80 are powered in any convenient manner to move the windshield through test position having antenna tester 110.

The antenna tester 110 as shown in FIG. 6 includes a vertical strut 112 having a transmitting and guard assembly 114 at one end and receiving assemblies 116 and 118 conveniently mounted adjacent the ends of horizontal strut 120. The transmitting and guard assembly 114 includes the transmitting plate 20 and guard plate 26 and the receiving assemblies 116 and 118 include the receiving plates 22 and 24 respectively attached in a manner discussed below for the receiving assembly 118. The antenna tester 110 is moved toward and away from the windshield in the test position by a piston assembly 122 shown only in FIG. 7. In general cylinder 124 of the piston assembly 122 is pivotably mounted at 126 to horizontal support 128. Piston 130 of the piston assembly 122 is pivotably connected at 132 to arm 134 which is pivotably connected at 135 to vertical arm 112. As the piston 130 moves out of the cylinder 124, the arm 134 pivots at 136 in a clockwise direction to move the tester 110 into the test position and drawing the piston 130 into the cylinder 124 moves the arm 134 in a counterclockwise direction as viewed in FIG. 7 to move the tester 110 against biasing action of spring 137 out of the test position. The spring 137 assists in biasing the tester 110 in the test position. The horizontal arm 128 is conveniently mounted to support 141 conveniently secured to the super structure 106.

In the instance where the windshield has a curvature, it is recommended that the transmitting and guard assembly 114 and receiving assemblies 116 and 118 be mounted for movement relative to the curvature. For example, and as shown in FIG. 7 the transmitting and guard assembly 114 has a collar 138 secured to support plate 139 rotably mounted and secured on shaft 140 of the vertical arm 112. With reference to FIGS. 6 and 7 the horizontal arm 120 supporting the receiving assemblies 116 and 118 similar has a collar 142 which is rotably mounted and secured on shaft 144 connected to the vertical arm 112. Spaced springs 146 act on each side of the shaft 142 to bias the horizontal arm 120 against the windshield to bias the receiving assemblies 116 and/or 118 against the windshield to be tested. In a similar manner, springs 148 about the pivot point 135 act on the vertical arm 112 to bias the horizontal arm 120 and/or the assembly 114 against the windshield to be tested.

With reference to FIG. 8, the receiving assembly 118 includes the receiving plate 24 e.g. copper plate secured to an epoxy board 152. The epoxy board 152 is conveniently mounted to 4 spaced posts 154 (see also FIG. 6). Each of the posts 154 has a threaded end 155 passing through the plate member 139. As upper nut 157 and lower nut 158 is mounted on each threaded end about the plate member 139 for adjusting the plate 24 relative to the upper surface of the glass sheet 36 as viewed in FIG. 8 to set the air gap therebetween which along with the size of plate 24 affects the capacitance value of $C_7$ and $C_8$ (see FIG. 3). A pair of wheels 159 (one only shown in FIG. 8 are each) rotably mounted in their respective housing 160 secured to the plate member 139 to maintain the set spaced distance between receiving plate 24 and adjacent surface of the windshield 32.

The receiving assembly 116 and guard and transmitting assembly 114 have their plates 22 and 26 and 20 respectively mounted in a similar manner as the receiving plate 24 is mounted for the receiving assembly 118 discussed above.

With reference to FIG. 6, as a windshield 32 on the carriage 80 conveniently moves into the test position, contactor 166 mounted on the intermediate strut 85 of the carriage 86 engages microswitch 168 to forward a signal along cable 170 to sequence controller 172. The sequence controller 172 forwards a signal along cable 174 to the controller 51 to begin the test. The check for antenna wire continuity does not require that piston assembly 122 be extended and then retracted for each windshield 32 tested. Normally, piston assembly 122 is held in the extended position so that the wheels or casters 159 will automatically engage the windshield 32 as it moves into the test station. When switch 168 is activated as carriage 80 continued through the test station, the continuity test is made without stopping the carriage 80 in the test station or position. If the test indicates that the antenna wire 43 is not continuous, the controller 51 forwards a signal along cable 180 to marker 182 (shown only in FIG. 7) to mark the unacceptable windshield.

If an empty carriage, i.e. a carriage having no windshield 32 moves into the test position, a signal e.g. from a limit switch (not shown) upstream of the test position is activated and conveniently forwarded along cable 179 to the sequence controller 172. The controller 172 forwards a signal along cable 176 to the piston assembly 122 to retract the tester 110 to ensure that the tester 110 is not contacted by the empty carriage moving through the test position.

As can now be appreciated, the above example is presented for illustration purposes and is not limiting to the invention.

What is claimed is:

1. A method of determining continuity of a conductor, comprising the steps of:
   forming with the conductor a capacitor intermediate its ends to provide a transmitting capacitance coupling;
   forming with the conductor a capacitor on each side of the transmitting capacitance coupling to provide a first receiving capacitance coupling and a second receiving capacitance coupling; and
   determining the potential difference between the first and second receiving capacitance coupling to determine continuity of the conductor at least between the first and second receiving capacitance couplings.

2. The method as set forth in claim 1 wherein the conductor is the antenna wire of an antenna system.

3. The method as set forth in claim 2 wherein the antenna wire is between a pair of laminated sheets of non-conductive material.

4. The method as set forth in claim 1 wherein the conductor is current carrying conductor for heating.

5. The method as set forth in claim 4 wherein the conductor is on an automotive lite.

6. The method as set forth in claim 4 wherein the conductor is between a pair of non-conductive sheets of an aircraft window.

7. The method as set forth in claim 6 wherein at least one of the sheets is glass.

8. The method as set forth in claim 7 wherein at least one of the sheets is plastic.

9. The method as forth in claim 1, 2, or 4 wherein said step of forming the transmitting capacitance coupling is accomplished by positioning a conductive member over and spaced from a segment of the conductor; and connecting the conductive member to a power source;
   said step of forming the first and second receiving capacitance couplings is accomplished by positioning a conductive member on each side of the conductive member of the transmitting capacitance coupling potential spaced from and above a segment of the conductor; and
   said determining step is accomplished by measuring the difference between the first and second capacitance coupling wherein the conductor has a break when the potential difference is a predetermined value and the conductor is continuous when the potential difference is other than the predetermined value.

10. The method as set forth in claim 9 wherein the conductor has a first segment along its course spaced from and adjacent a second segment of the conductor and said step of forming a capacitor to provide a transmitting capacitance coupling and further including the step:
    preventing capacitance coupling between the first and second segments of the conductor.

11. The method as set forth in claim 10 wherein said preventing step is accomplished by:
    positioning a conductive member spaced from and over the second segment of the conductor to provide a guard plate, the guard plate being electrically isolated from the conductive member of the transmitting capacitance coupling; and,
    connecting the guard plate to a terminal of the power supply and to ground.

12. The method as set forth in claim 11 wherein the conductor is the antenna wire of an antenna windshield further including the step of:
    moving the windshield and conductive plates relative to one another.

13. The method as set forth in claim 12 wherein said moving step is accomplished by moving the windshield into a test position and moving the plates toward the windshield in the test position to determine continuity of the antenna wires.

14. The method as set forth in claim 13 where the antenna wire is at least between the conductive members of the receiving capacitance coupling is continuous when the potential difference between the receiving capacitance coupling is about 0 and further including the step of marking the windshields having a potential difference other than about 0.

15. An apparatus testing continuity of a conductor, comprising: means for forming a transmitting capacitance coupling;
    means for forming first and second receiving capacitance couplings in spaced relationship to one another and to the transmitting capacitance couplings; and,
    means for determining potential difference between said first and second transmitting capacitance coupling.

16. The apparatus as set forth in claim 15 further including means for preventing the formation of a capacitor adjacent said means for forming a transmitting capacitance coupling; said preventing means being electrically isolated from said means for forming a transmitting coupling mounted adjacent to and spaced from said means for forming a transmitting capacitance coupling.

17. The apparatus as set forth in claim 16 wherein said means for forming a transmitting capacitance coupling; means for forming a first and second receiving capacitance coupling and said preventing means each include an electrical conductive member.

* * * * *